United States Patent [19]

Frank et al.

[11] Patent Number: 5,254,216
[45] Date of Patent: Oct. 19, 1993

[54] OXYGEN SCAVENGING IN A PLASMA REACTOR

[75] Inventors: James G. Frank, Richardson; Gabriel G. Barna, Richardson, both of Tex.

[73] Assignee: Texas Instruments Incorporated, Dallas, Tex.

[21] Appl. No.: 719,219

[22] Filed: Jun. 21, 1991

[51] Int. Cl.[5] ............................................. H01L 21/00
[52] U.S. Cl. ................................. 156/643; 156/345; 427/111; 427/569; 423/594
[58] Field of Search ................ 156/643, 345; 427/111, 427/37, 569; 252/181.1, 181.2; 423/594

[56] References Cited

U.S. PATENT DOCUMENTS 4,800,070 1/1989 Carlin et al. ..................... 423/210.5
4,927,398 5/1990 Shaffer .................................. 445/9
5,068,007 11/1991 Rogers et al. ....................... 156/643

OTHER PUBLICATIONS

Plasma Etching in Semiconductor Fabrication; ed. Russ A. Morgan; ©1985; N.Y., N.Y.; pp. 96–97.

Primary Examiner—Brian E. Hearn
Assistant Examiner—George Goudreau
Attorney, Agent, or Firm—Peter T. Rutkowski; Richard L. Donaldson

[57] ABSTRACT

Trace amounts of oxygen are removed from a plasma reactor by heating a filament during the times the reactor is not processing to cause the filament to react with the oxygen in the reactor, and forms an oxide of the filament material and the oxygen.

5 Claims, 1 Drawing Sheet

OXYGEN SCAVENGING IN A PLASMA REACTOR

FIELD OF THE INVENTION

This invention relates to a plasma etching reactor and process, and more particularly to an apparatus and method for removing traces of oxygen from a reactor.

BACKGROUND OF THE INVENTION

In the manufacturing of semiconductor devices, trace amounts of oxygen has a detrimental effect. In the etching of an aluminum film, oxygen promotes the formation of $Al_2O_3$, which becomes a barrier to the etching of ALUMINUM (Al) films. In the etching of oxide over silicon, with a typical $CHF_3/CF_4$, the presence of oxygen shifts the F/C ratio in the favor of the F, by reacting with the Carbon. The excess F then increases the etch rate of the silicon, thereby decreasing the selectivity of the etch.

This problem is typically handled by a chemical process, for example, in the etching of Al, one of the process gases is $BCl_3$. The principal function of this gas is to react with the $Al_2O_3$ formed on the Al surface and to getter any oxygen in the reactor via the formation of $B_2O_3$. With this procedure, chemical side-effects are created. $B_2O_3$ is deposited through the vacuum system, which a serious problem from the viewpoint of particles and general rector cleanliness.

BRIEF SUMMARY OF THE INVENTION

The invention is to an apparatus and method of scavenging oxygen in a plasma reactor. A metallic filament, for example W, Ti or NiCr, is placed in a reactor. When power is applied to the filament and the filament glows, the filament will become reactive with any oxygen in the reactor forming an oxide film and removing the traces of oxygen form the reactor. Power is applied to the filament during the OFF portions of each etch cycle so to prevent the filament from reacting with volatile etch gases. The filament is also energized during wafer transport and pump down cycles to remove traces of oxygen.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
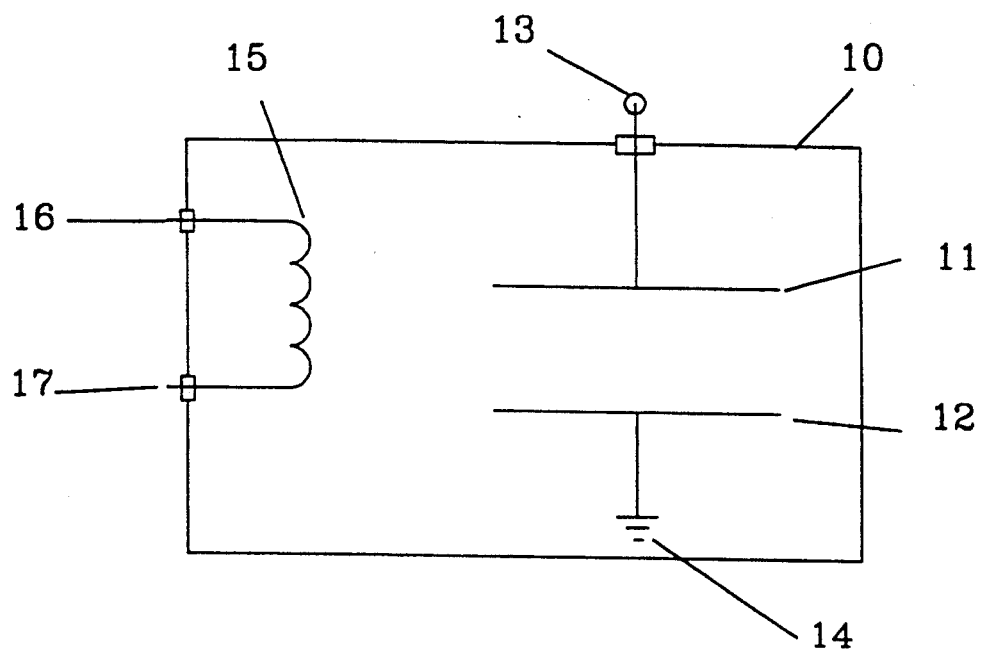
FIG. 1 is illustrates the use of a filament in a rector for scavenging oxygen in the reactor.

FIG. 1 illustrates a reactor 10 that is used for plasma etching or other similar processes. Reactor 10 includes plates 11 and 12, between which a semiconductor wafer is placed during processing. Plate 12 is grounded at 14 and plate 11 is attached to a radio frequency source of energy 13. During processing, a semiconductor wafer is placed between plates 11 and 12, RF energy is applied to the plates and, for example, an etchant gas flows across the semiconductor.

To remove traces of oxygen in the reactor, a filament 15 is cause to glow by applying power across terminals 16 and 17. Filament 15 has power applied to it prior to processing to remove traces of oxygen in the reactor. Power may also be applied between process steps to ensure that any oxygen introduced into the reactor along with non-volatile process gases, or during evacuation of process gases is removed.

A simplified example of a process may be as follows. A semiconductor wafer is moved into the reactor and the reactor is sealed. Filament 15 is powered to remove oxygen introduced while the wafer was being moved into the reactor. The filament may be powered during the pump-down cycle in which a vacuum is created in the reactor. Filament 15 is then turned-off while etchant or deposition gases flow in the reactor across the semiconductor wafer. The deposition or etchant gases are then removed and filament 15 may then again be powered to remove any traces of oxygen that may be in the reactor prior to any subsequent process step.

What is claimed:

1. A method for scavenging traces of oxygen from a semiconductor wafer process chamber prior to and between process steps, comprising the steps of:
   evacuating the process chamber; and
   applying power to a filament to heat the filament to a temperature to react with and remove trace amounts of oxygen.

2. The method according to claim 1, wherein said filament is tungsten.

3. The method according to claim 1, wherein said filament is nickel-chromium.

4. The method according to claim 1, wherein said filament is titanium.

5. The method according to claim 1, wherein during the time the filament is heated, oxygen reacts with the material of the filament to form an oxide thereof.

* * * * *